United States Patent
Pequignot et al.

(10) Patent No.: US 6,262,873 B1
(45) Date of Patent: Jul. 17, 2001

(54) METHOD FOR PROVIDING ESD PROTECTION FOR AN INTEGRATED CIRCUIT

(75) Inventors: James P. Pequignot, Essex Junction; Tariq Rahman; Jeffrey H. Sloan, both of Burlington; Douglas W. Stout, Milton; Steven H. Voldman, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/657,081

(22) Filed: Sep. 7, 2000

Related U.S. Application Data (62) Division of application No. 09/224,766, filed on Jan. 4, 1999, now Pat. No. 6,157,530.

(51) Int. Cl.[7] .......................................... H02H 3/22
(52) U.S. Cl. .................... 361/111; 361/56; 716/5
(58) Field of Search ........................... 361/56, 54, 111; 716/1–5, 16

(56) References Cited

U.S. PATENT DOCUMENTS

| | | |
|---|---|---|
| 5,237,395 | 8/1993 | Lee . |
| 5,416,661 | 5/1995 | Furuta . |
| 5,465,190 | 11/1995 | Meunier et al. . |
| 5,530,612 | 6/1996 | Maloney . |
| 5,559,659 | 9/1996 | Strauss . |
| 5,568,346 | 10/1996 | Orchard-Webb . |
| 5,610,790 | 3/1997 | Staab et al. . |
| 5,610,791 | 3/1997 | Voldman . |
| 5,617,283 | 4/1997 | Krakauer et al. . |
| 5,625,280 | 4/1997 | Voldman . |
| 5,631,793 | 5/1997 | Ker et al. . |
| 5,642,252 | 6/1997 | Sakamoto et al. . |
| 5,644,459 | 7/1997 | Lien . |
| 5,654,862 | 8/1997 | Worley et al. . |
| 5,679,971 | 10/1997 | Tamba et al. . |
| 5,686,751 | 11/1997 | Wu . |
| 5,704,054 * | 12/1997 | Bhattacharya ........................ 395/388 |
| 5,706,156 | 1/1998 | Narita . |
| 5,721,656 | 2/1998 | Wu et al. . |
| 5,729,419 | 3/1998 | Lien . |
| 5,744,842 | 4/1998 | Ker . |
| 5,745,323 | 4/1998 | English et al. . |
| 5,796,638 * | 8/1998 | Kang et al. ..................... 395/500.06 |
| 5,798,645 * | 8/1998 | Zeiner et al. ......................... 364/578 |
| 5,907,464 | 5/1999 | Maloney et al. . |
| 5,999,714 * | 12/1999 | Conn et al. ..................... 395/500.03 |

\* cited by examiner

*Primary Examiner*—Michael J. Sherry
*Assistant Examiner*—Kim Huynh
(74) *Attorney, Agent, or Firm*—Schmeiser, Olsen & Watts; Eugene I. Shkurko (57) ABSTRACT

A method for automatically generating a custom ESD network for an integrated circuit is provided. When a user provides chip size and chip capacitance for the integrated circuit, components for the customized ESD network are automatically selected based on the user-provided chip size and chip capacitance and the adequacy of the ESD behavior of an ESD network employing the selected components is evaluated.

5 Claims, 5 Drawing Sheets

METHOD FOR PROVIDING ESD PROTECTION FOR AN INTEGRATED CIRCUIT

This application is a divisional of Ser. No. 09/224,766, filed on Jan. 4, 1999 now U.S. Pat. No. 6,157,530.

FIELD OF THE INVENTION

The present invention generally relates to electrostatic discharge (ESD) and electrical overstress (EOS) protection circuitry and more particularly to ESD and EOS protection circuitry for electronic circuits employing multiple power supply rails.

BACKGROUND OF THE INVENTION

Techniques for protecting integrated circuits from large, undesirable current and voltage signals (e.g., ESD, EOS, etc.) are well known, particularly for integrated circuits employing a single power supply rail (hereinafter "power rail"). In single power rail systems, ESD and EOS protection circuitry (hereinafter "ESD circuitry") need only be provided between a single power rail and a reference power rail such as ground (hereinafter "reference rail"). More recently, multiple power rail applications such as mixed-voltage interface circuitry, dynamic random access memory (DRAM) circuitry and the like have necessitated ESD protection between multiple power rails as well as between each power rail and ground.

Many multiple power rail applications have the additional requirement that power rails must be able to be powered-up or powered-down in any sequence without generating wasteful or harmful voltage or current conditions between the power rails (i.e., a sequence independence or power-up/power-down independence requirement). For example, an interface circuit between a printer and a computer should prevent current flow between the computer and the printer when only one of the computer and the printer is ON.

Figure 1:
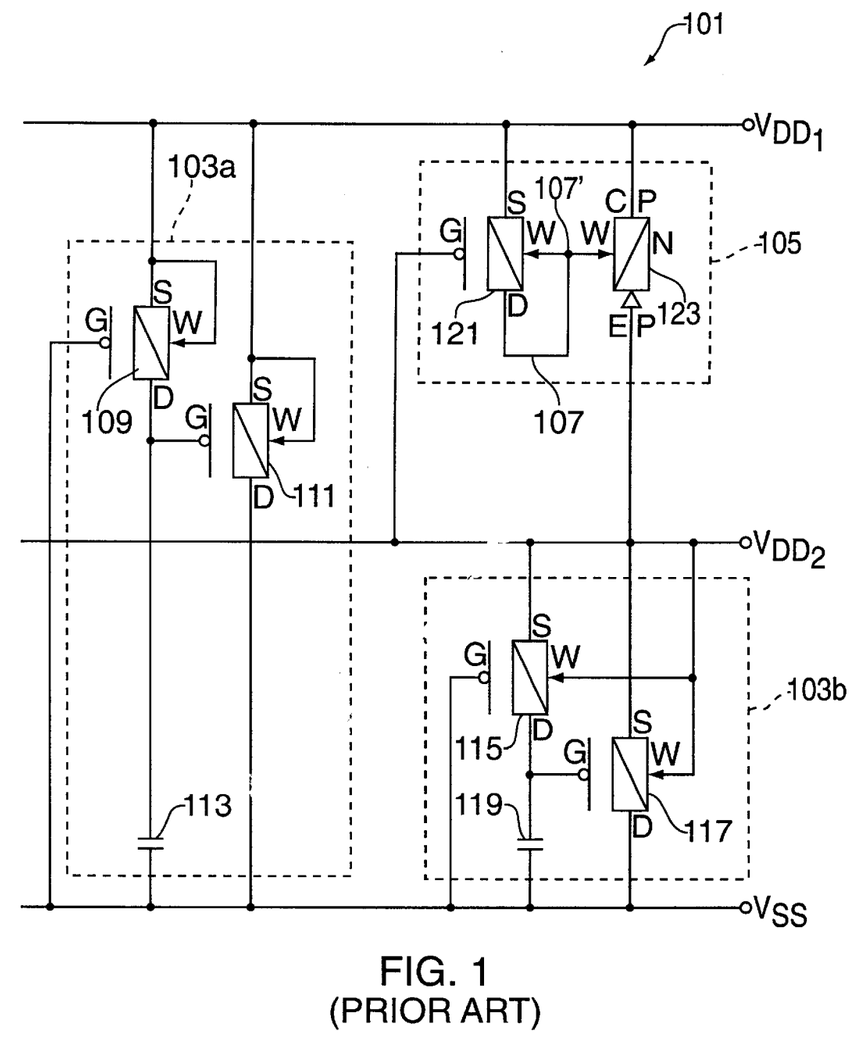
FIG. 1 is a schematic diagram of conventional ESD circuitry as previously described.

One conventional technique for providing multiple power rail, sequence independent ESD circuitry is disclosed in commonly assigned U.S. Pat. No. 5,610,791 to Voldman and is described with reference to FIG. 1. Specifically, FIG. 1 shows conventional ESD circuitry 101 which comprises a first single-rail ESD circuit 103$a$ connected between a first power rail ($V_{DD1}$) and a reference rail ($V_{SS}$) (e.g., ground), a second single-rail ESD circuit 103$b$ connected between a second power rail ($V_{DD2}$) and the reference rail ($V_{SS}$), and an inter-rail ESD circuit 105 connected between the first and the second power rails ($V_{DD1}$), ($V_{DD2}$). As described below, each single-rail ESD circuit 103$a$, 103$b$ produces a low impedance path between the single-rail ESD circuit's respective power rail and the reference rail ($V_{SS}$) in response to an ESD impulse on the respective power rail so that the ESD impulse's energy is harmlessly dissipated (i.e., providing "single-rail" ESD protection). Similarly, the inter-rail ESD circuit 105 produces a low impedance path between the first and the second power rails ($V_{DD1}$), ($V_{DD2}$) in response to an ESD impulse applied therebetween so that the ESD impulse's energy is harmlessly dissipated (i.e., providing "inter-rail" ESD protection). A control connection 107 within the inter-rail ESD circuit 105 prevents the inter-rail ESD circuit 105 from dissipating current between the first and the second power rails ($V_{DD1}$), ($V_{DD2}$) in a sequence independent manner (as described below).

The first single-rail ESD circuit 103$a$ comprises a plurality of p-channel metal-oxide-semiconductor field-effect-transistors (PFETs), specifically a first PFET 109 and a second PFET 111, and a first capacitor 113. The first PFET 109 has a source lead "S" and well lead "W" connected to the first power rail ($V_{DD1}$), a gate lead "G" connected to the reference rail ($V_{SS}$), and a drain lead "D" connected to the gate lead "G" of the second PFET 111 and to the reference rail ($V_{SS}$) via the first capacitor 113. The second PFET 111 has a source lead "S" and a well lead "W" connected to the first power rail ($V_{DD1}$) and a drain lead "D" connected to the reference rail ($V_{SS}$). The second single-rail ESD circuit 103$b$ comprises a third PFET 115, a fourth PFET 117 and a second capacitor 119 similarly interconnected between the second power rail ($V_{DD2}$) and the reference rail ($V_{SS}$).

In operation, with the gate lead of the first PFET 109 connected to the reference rail ($V_{SS}$) (e.g., ground), the first PFET 109 is ON and behaves as a resistor connected between the gate lead of the second PFET 111 and the first power rail ($V_{DD1}$). The first PFET 109 and the first capacitor 113 thus form an RC discriminator (e.g., a low pass filter) such that the first capacitor 113 can charge quickly enough to track low frequency (e.g., D.C.) voltage changes on the first power rail ($V_{DD1}$). Accordingly, absent a high frequency change in voltage on the first power rail ($V_{DD1}$), the voltage present on the gate of the second PFET 111 and the voltage present on the source of the second PFET 111 remain approximately equal (e.g., $V_{GS}$=0), and the second PFET 111 remains OFF. However, with the channel resistance R of the first PFET 109 and the capacitance C of the first capacitor 113 properly chosen, the first capacitor 113 is unable to charge quickly enough to track the high frequency voltage changes on the first power rail ($V_{DD1}$) due to an ESD impulse. Accordingly, when an ESD impulse is present on the first power rail ($V_{DD1}$), the voltage present on the gate of the second PFET 111 initially remains unchanged (as the first capacitor 113 charges toward the ESD impulse's voltage) while the source and the well of the second PFET 111 track the voltage of the ESD impulse. The gate-to-source voltage of the second PFET 111, therefore, exceeds the second PFET 111's threshold voltage and the second PFET 111 turns ON. With the second PFET 111 ON, a low impedance path is created between the first power rail ($V_{DD1}$) and the reference rail ($V_{SS}$).

The second PFET 111 remains ON until the first capacitor 113 charges to a voltage sufficient to turn OFF the second PFET 111 or until the ESD impulse is dissipated, whichever occurs first. If the charging time for the first capacitor 113 is sufficiently long (as set by the RC time constant of the current path to the first capacitor 113, which is set by the first PFET 109 and the first capacitor 113), the second PFET 111 will remain ON long enough for the ESD impulse to be harmlessly dissipated (e.g., to ground). The second single-rail ESD circuit 103$b$ behaves identically with respect to the second power rail ($V_{DD2}$).

The inter-rail ESD circuit 105 comprises a fifth PFET 121 and a first PNP transistor 123. The fifth PFET 121 has a gate lead "G" connected to the second power rail ($V_{DD2}$), a source lead "S" connected to the first power rail ($V_{DD1}$) and a drain lead "D" connected to the well "W" of the fifth PFET 121 and to the well "W" (e.g., the base) of the first PNP transistor 123 via the control connection 107 (forming a node 107'). The first PNP transistor 123 has a collector lead "C" connected to the first power rail ($V_{DD1}$) and an emitter lead "E" connected to the second power rail ($V_{DD2}$). For reasons described below, the fifth PFET 121 is sized much smaller than the first PNP transistor 123 and the first PNP transistor 123 is symmetrically doped.

When an ESD impulse is present across the first and the second power rails ($V_{DD1}$), ($V_{DD2}$), the fifth PFET 121 has little affect on the response of the first PNP transistor 123 (due to its small size relative to the first PNP transistor 123). For instance, with an ESD impulse induced on the first power rail ($V_{DD1}$) relative to the second power rail ($V_{DD2}$), the collector of the first PNP transistor 123 is pulled high rapidly via the ESD impulse and the first PNP transistor 123's collector-base junction is forward biased while the first PNP transistor 123's emitter-base junction is reverse biased. The first PNP transistor 123 thereby is turned ON, current flows from the first power rail ($V_{DD1}$) to the second power rail ($V_{DD2}$) and the ESD impulse is harmlessly dissipated. Base current is "forced" through the fifth PFET 121 during dissipation of the ESD impulse.

Similarly, with an ESD impulse induced on the second power rail ($V_{DD2}$) relative to the first power rail ($V_{DD1}$), the first PNP transistor 123's emitter is pulled high rapidly via the ESD impulse and the first PNP transistor's emitter-base junction is forward biased while the first PNP transistor 123's collector-base junction is reverse biased. The first PNP transistor 123 thereby is turned ON, current flows from the second power rail ($V_{DD2}$) to the first power rail ($V_{DD1}$) and the ESD impulse is harmlessly dissipated. Again, base current is forced through the fifth PFET 121 during dissipation of the ESD impulse.

The primary role of the fifth PFET 121 is to provide sequence independence between the first and the second power rails ($V_{DD1}$), ($V_{DD2}$). For example, if the first and the second power rails ($V_{DD1}$), ($V_{DD2}$) are initially at ground potential, a typical power-on sequence might comprise raising the first power rail ($V_{DD1}$) to a first voltage (e.g., 2.5 v) prior to raising the second power rail to a second voltage (e.g., 3.3 v). With the first power rail ($V_{DD1}$) at the first voltage while the second power rail ($V_{DD2}$) is grounded, the fifth PFET 121 is turned ON and the node 107' is raised (e.g., charged) to the first voltage.

The base-collector junction of the first PNP transistor 123 is unbiased and the base-emitter junction of the first PNP transistor 123 is reverse biased. Accordingly, the first PNP transistor 123 remains OFF.

When the second power rail ($V_{DD2}$) is raised to the second voltage (e.g., 3.3v), the fifth PFET 121 turns OFF. The node 107' charges from the first voltage to approximately the second voltage minus the forward voltage of the first PNP transistor 123's base-emitter junction and the first PNP transistor 123 remains OFF. If the first power rail ($V_{DD1}$) thereafter is grounded, the first PNP transistor 123's base-emitter junction remains insufficiently forward biased for the first PNP transistor 123 to turn ON. Accordingly, the first and the second power rails ($V_{DD1}$), ($V_{DD2}$) may be powered-up or powered-down in any sequence without generating wasteful or harmful voltage or current conditions between the first and the second power rails ($V_{DD1}$), ($V_{DD2}$).

The conventional ESD circuitry 101 of FIG. 1 provides excellent ESD protection for integrated circuits employing power rail voltages of at least 2.5 volts (e.g., $V_{DD1}$=2.5v, $V_{DD2}$=3.3v, etc.). However, for circuitry employing lower voltage power rails (e.g., $V_{DD1}$=1.8 v, $V_{DD2}$=2.5v, etc.), the "ESD trigger voltage" required to turn ON the first PNP transistor 123 (e.g., about 9 volts) is too large to prevent damage to the smaller dimension transistors (e.g., MOS-FETS having lower snap-back voltages) typically employed within lower power rail voltage integrated circuits. Because there exists no easy method for reducing the ESD trigger voltage of the first PNP transistor 123 the conventional ESD circuitry 101 of FIG. 1 cannot be scaled for use with lower power rail voltage integrated circuits.

In addition to lacking scaleability, the conventional ESD circuitry 101 also is difficult to tune. Specifically, gate capacitance contributions from the second PFET 111 affect the RC characteristics of the low pass filter formed from the first PFET 109 and the first capacitor 113, and must be considered during the selection of the first capacitor 113. Similarly, gate capacitance contributions from the fourth PFET 117 affect the RC characteristics of the low pass filter formed from the third PFET 115 and the second capacitor 119, and must be considered during the selection of the second capacitor 119. The second and the fourth PFETs 111, 117, therefore, cannot be optimized without affecting the selection of the first and the second capacitors 113, 119, and vice versa. Further, many designers prefer non-PFET based circuit designs due to the threshold-voltage dependence associated with PFETs that can lead to high temperature thermal runaway in PFET based networks.

Accordingly, a need exists for a method and apparatus for providing scaleable ESD protection with predictable RC characteristics that ensure proper ESD impulse dissipation. Such a method and apparatus will alleviate the need for ESD circuitry redesign for each successive generation of lower voltage circuitry.

SUMMARY OF THE INVENTION

To address the needs of prior art multiple power rail ESD circuitry, in a first aspect of the invention, ESD circuitry is provided that has both inventive inter-rail ESD protection (e.g., for use between power rails) and inventive single-rail ESD protection (e.g., for use between each power rail and a reference rail such as ground). Unlike conventional inter-rail ESD circuitry, the inventive inter-rail ESD circuitry is completely scalable and therefore may be used with any power rail voltages. The novel inter-rail ESD circuitry comprises one or more sets of series connected diodes (i.e., one or more diode strings) for interconnecting each pair of power rails. Preferably two diode strings are connected between each pair of power rails so as to provide sequence independence for each power rail (e.g., the number of diodes within each diode string preferably comprises at least the number of diodes required to prevent conduction of the diode string when one power rail within a power rail pair is grounded). The number of diodes within a diode string also sets the trigger voltage for ESD protection. Accordingly, to scale the inventive inter-rail ESD circuitry, the number of diodes within each diode string is increased or decreased as needed so as to adjust the ESD trigger voltage.

The inventive single-rail ESD circuitry comprises an RC discriminator (e.g., a low pass filter) connected between a power rail and a reference rail (e.g., ground) that controls the operation of a transistor responsible for creating a low impedance path between the power rail and the reference rail (i.e., a clamping transistor) so as to dissipate an ESD impulse present on the power rail. However, unlike conventional single-rail ESD circuits, the inventive single-rail ESD circuitry comprises a mechanism for isolating the RC discriminator from the clamping transistor.

The isolating mechanism eliminates the influence of the clamping transistor's gate capacitance on the RC characteristics of the RC discriminator controlling the clamping transistor and thus allows the size or other properties of the clamping transistor to be varied without affecting the ESD impulse dissipation behavior of the RC discriminator. Preferably, the isolating mechanism comprises a plurality of inverters, most preferably a plurality of CMOS inverters.

Additionally, the clamping transistor preferably comprises an n-channel MOSFET (hereinafter "NFET") to eliminate any possibility of high temperature thermal runaway during operation of the inventive ESD circuitry.

In a second aspect of the invention, an electronic network is provided comprising a gate-array format of resistors, capacitors, p-channel and n-channel MOSFETs (i.e., a sea of gate elements), diodes (e.g., bipolar transistors) and the like (i.e., an ESD repository of ESD components) employable to construct, optimize, customize and tune ESD networks (e.g., for application specific integrated circuit (ASIC) applications). As used herein the term gate-array means an integrated circuit containing a plurality of unconnected devices that may be interconnected via final metallization steps or other known processes or techniques (i.e., an interconnection method) according to a user specified pattern so as to achieve a user specified function. Preferably, the components within the ESD repository are optimized for ESD/EOS protection.

By employing an ESD repository, ESD networks can be optimized and customized for each user's specific circuit implementation. For example, if the inventive ESD circuitry is used, the RC characteristics of each RC discriminator may be tuned so as to affect optimal ON times for each clamping transistor, the size of each clamping transistor may be varied for optimum ESD protection, the number of diodes within each diode string may be varied to achieve sequence independence or dependence and/or to adjust the ESD trigger voltage, etc.

In a third aspect of the invention, a method for automatically generating a custom ESD network for an integrated circuit is provided. The custom ESD network preferably is generated from components within the inventive gate-array format ESD repository described above based on one or more characteristics of the integrated circuit. Preferably, a user provides the chip size and the chip capacitance for the integrated circuit and based thereon the components for a customized ESD network are automatically selected. The ESD behavior of an ESD network employing the selected components then is simulated to determine if the level of ESD protection provided by the network is adequate. If the level of ESD protection is adequate, the customized ESD network is created (e.g., from the components within the ESD repository); otherwise the various components within the customized ESD network are tuned (e.g., the RC characteristics of each RC discriminator are varied, the width and length of the employed transistors, such as the clamping transistors, are varied, etc.) and the ESD behavior of an ESD network employing the tuned components is simulated to determine the adequacy of the ESD protection provided. This procedure is repeated until adequate ESD protection results. A highly effectively ESD network thereby is provided.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 2:
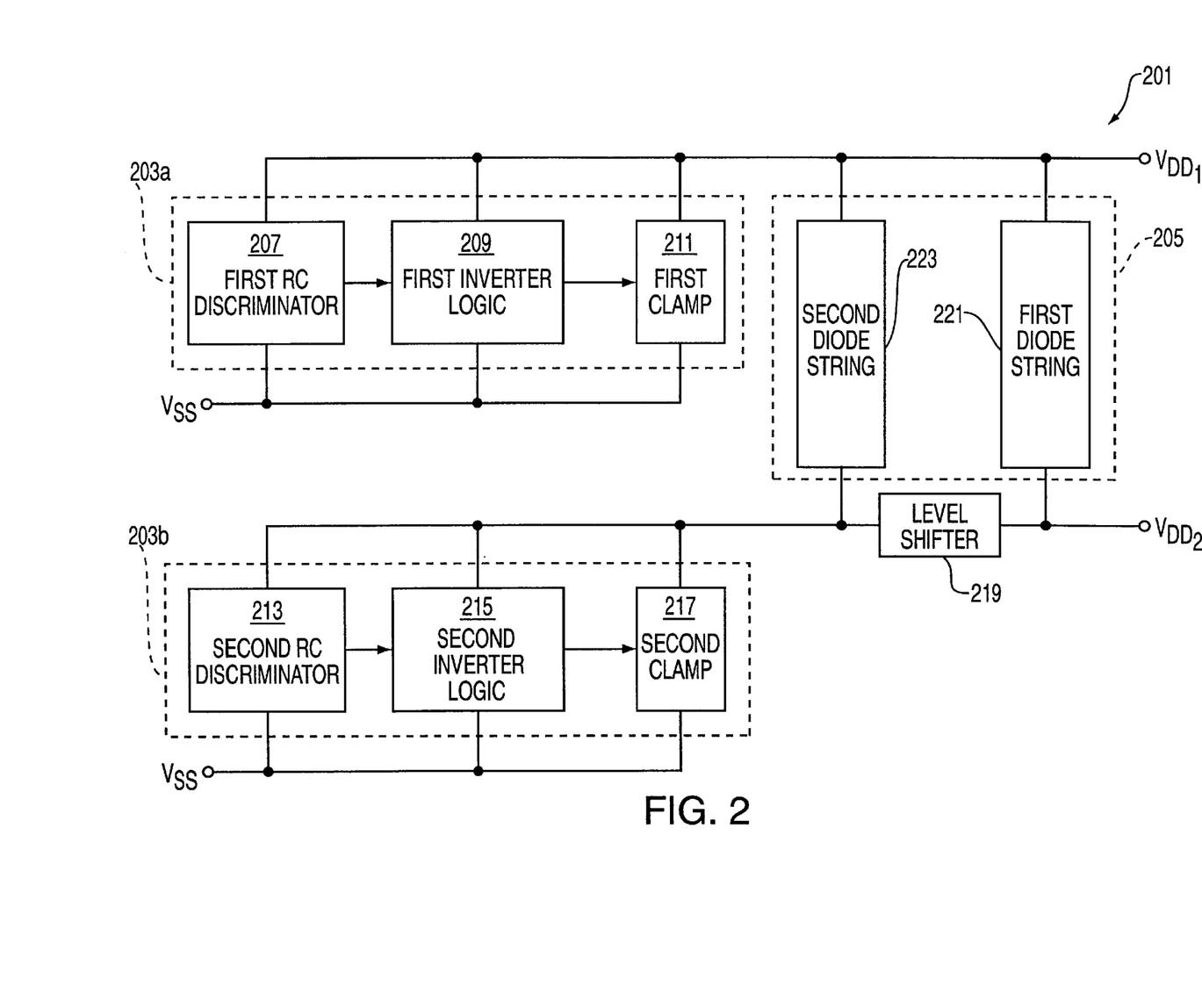
FIG. 2 is a block diagram of the main functional units of inventive ESD circuitry for providing ESD and EOS protection within a multiple power rail application in accordance with a first aspect of the invention.

FIG. 2 is a block diagram of the main functional units of inventive ESD circuitry 201 for providing ESD and EOS protection within a multiple power rail application in accordance with a first aspect of the invention. For illustrative purposes only, the ESD circuitry 201 is described with reference to a two power rail integrated circuit comprising a first power rail ($V_{DD1}$), a second power rail ($V_{DD2}$) and a reference rail ($V_{SS}$) (e.g., a ground plane). It will be understood that the inventive ESD/EOS protection concepts described herein may be employed with integrated circuits having any number of power rails.

With reference to FIG. 2, the inventive ESD circuitry 201 comprises a first single-rail ESD circuit 203a connected between the first power rail ($V_{DD1}$) and the reference rail ($V_{SS}$), a second single-rail ESD circuit 203b connected between the second power rail ($V_{DD2}$) and the reference rail ($V_{SS}$), and an inter-rail ESD circuit 205 connected between the first and the second power rails ($V_{DD1}$), ($V_{DD2}$). As described below, each single-rail ESD circuit 203a, 203b provides a low impedance path between the single-rail ESD circuit's respective power rail and the reference rail ($V_{SS}$) in response to an ESD impulse on the respective power rail so that the ESD impulse's energy is harmlessly dissipated (e.g., to ground). Similarly, the inter-rail ESD circuit 205 provides a low impedance path between the first and the second power rails ($V_{DD1}$), ($V_{DD2}$) in response to an ESD impulse applied therebetween so that the ESD impulse's energy is harmlessly dissipated.

The first single-rail ESD circuit 203a comprises a first RC discriminator 207, first inverter logic 209 and a first clamp 211, each connected between the first power rail ($V_{DD1}$) and the reference rail ($V_{SS}$). The first RC discriminator 207 is connected to the first clamp 211 via the first inverter logic 209.

The second single-rail ESD circuit 203b comprises a second RC discriminator 213, second inverter logic 215 and a second clamp 217, each connected between the second power rail ($V_{DD2}$) and the reference rail ($V_{SS}$). The second RC discriminator 213 is connected to the second clamp 217 via the second inverter logic 215. A level shifter 219 within the inventive ESD circuitry 201 reduces the voltage applied across the second clamp 217 so as to reduce stress on the second clamp 217.

In operation, the first RC discriminator 207 generates an output signal in response to an ESD impulse on the first power rail ($V_{DD1}$). The output signal is buffered by the first inverter logic 209 and turns on the first clamp 211 for a time period primarily set by the RC characteristics of the first RC discriminator 207. The first clamp 211 thereby creates a low impedance path between the first power rail ($V_{DD1}$) and the reference rail ($V_{SS}$) that harmlessly dissipates the ESD impulse.

Unlike the first RC discriminator of the first single-rail ESD circuit 103a of FIG. 1, the first RC discriminator 207 of the first single-rail ESD circuit 203a is isolated from its clamping transistor (e.g., the first clamp 211). As such, any capacitance associated with the first clamp 211 (e.g., gate capacitance) does not affect the RC characteristics of the first RC discriminator 207. Accordingly, properties of the first clamp 211 (e.g., size) can be optimized without requiring the first RC discriminator 207 to be re-tuned. Greater control over the first RC discriminator 207 and the first clamp 211 thereby is provided. The second single-rail ESD circuit 203b behaves identically to the first single-rail ESD circuit 203a with respect to the second power rail ($V_{DD2}$) and provides similar isolation between the second RC discriminator 213 and the second clamp 217 via the second inverter logic 215. More specific operational details of the first and the second single-rail ESD circuits 203a, 203b are explained below with reference to the preferred embodiment for the inventive ESD circuitry 201 shown in FIG. 3.

The inter-rail ESD circuit 205 comprises a first diode string 221 and a second diode string 223 both connected between the first and the second power rails ($V_{DD1}$), ($V_{DD2}$). Each diode string 221, 223 allows conduction between the first and the second power rails ($V_{DD1}$), ($V_{DD2}$) in a different direction. For example, an ESD impulse on the first power rail ($V_{DD1}$) relative to the second power rail ($V_{DD2}$) may cause the first diode string 221 to conduct and dissipate the ESD impulse. Likewise, an ESD impulse on the second power rail ($V_{DD2}$) relative to the first power rail ($V_{DD1}$) may cause the second diode string 223 to conduct and dissipate the ESD impulse.

To achieve power-up and power-down sequence independence between the first and the second power rails ($V_{DD1}$), ($V_{DD2}$), the number of diodes within each diode string 221, 223 preferably is sufficient to prevent conduction between the two power rails when one of the power rails is grounded. The number of diodes within each diode string 221, 223 sets the ESD trigger voltage for ESD impulse dissipation and is scalable merely by increasing or decreasing the number of diodes with each diode string 221, 223. More specific operational details of the first and the second diode strings 221, 223 are explained below with reference to the preferred embodiment for the inventive ESD circuitry 201 shown in FIG. 3.

Figure 3:
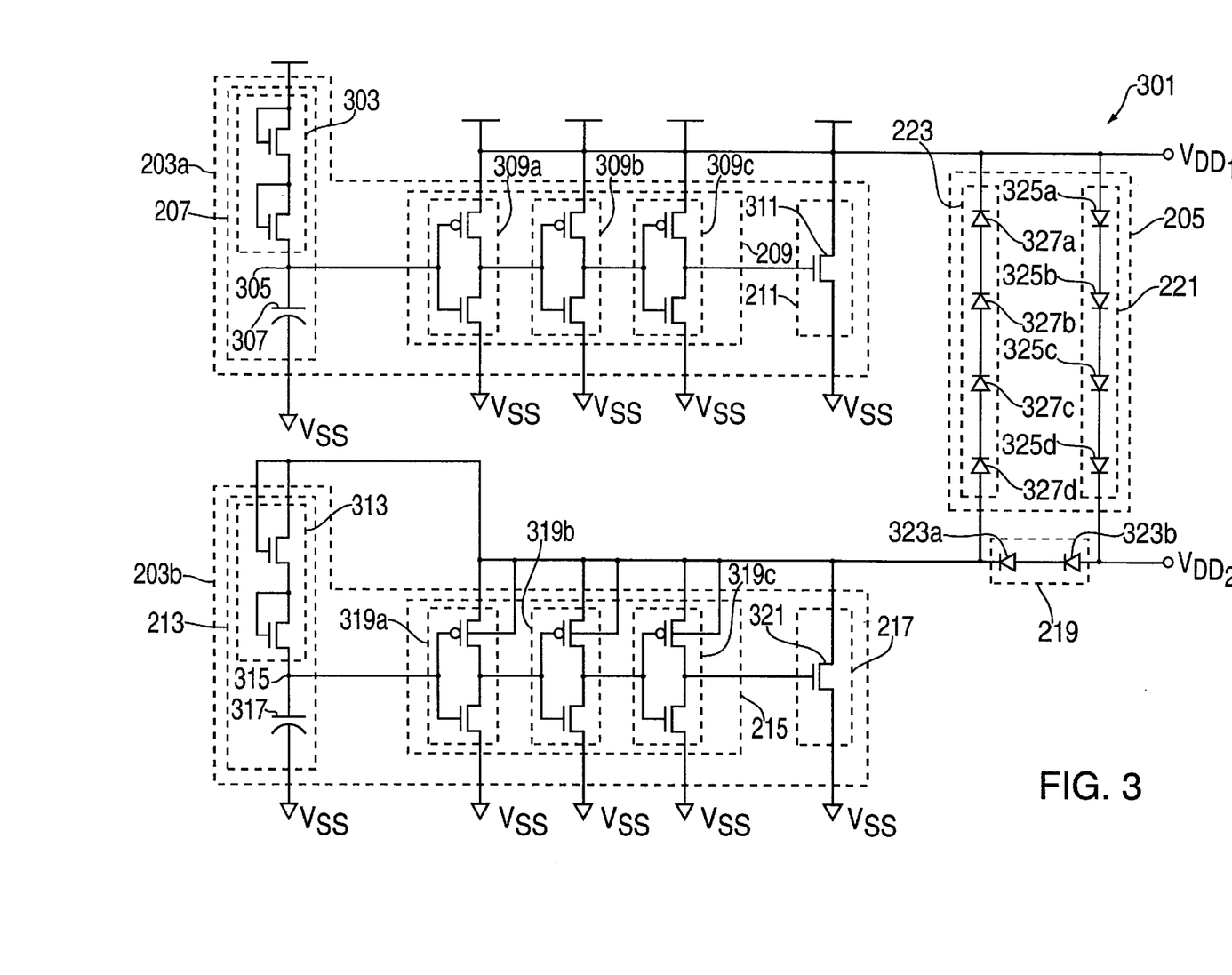
FIG. 3 is a schematic diagram of inventive ESD circuitry that represents a preferred embodiment for the ESD circuitry of FIG. 2.

FIG. 3 is a schematic diagram of an ESD circuit 301 that represents a preferred embodiment for the ESD circuitry 201 of FIG. 2. The ESD circuit 301 comprises the first single-rail ESD circuit 203a having the first RC discriminator 207, the first inverter logic 209 and the first clamp 211 connected between the first power rail ($V_{DD1}$) and the reference rail ($V_{SS}$), the second single-rail ESD circuit 203b having the second RC discriminator 213, the second inverter logic 215 and the second clamp 217 connected between the second power rail ($V_{DD2}$) and the reference rail ($V_{SS}$), the inter-rail ESD circuit 205 having the first and the second diode strings 221, 223 connected between the first and the second power rails ($V_{DD1}$), ($V_{DD2}$), and the level shifter 219. A typical voltage for the first power rail ($V_{DD1}$) is 1.8 volts and a typical voltage for the second power rail ($V_{DD2}$) is 2.5 volts.

The first RC discriminator 207 comprises a low pass filter comprising a first resistor 303 connected between the first power rail ($V_{DD1}$) and a first node 305, and a first capacitor 307 connected between the first node 305 and the reference rail ($V_{SS}$). The first resistor 303 preferably comprises one or more series connected MOSFETs as shown.

The first inverter logic 209 comprises a plurality of complementary metal-oxide-semiconductor (CMOS) inverters, specifically a first CMOS inverter 309a, a second CMOS inverter 309b and a third CMOS inverter 309c. The input of the first CMOS inverter 309a is connected to the first node 305 of the first RC discriminator 207 and the output of the third CMOS inverter 309c is connected to the first clamp 211. The first clamp 211 preferably comprises a first n-channel MOSFET 311 ("first NFET 311") that serves as a first clamping transistor having a gate lead connected to the output of the third CMOS inverter 309. A PFET may be similarly employed as the first clamp 211 if an even number of inverters is employed within the first inverter logic 209.

In operation, the first RC discriminator 207 behaves as a low pass filter such that for low frequency (e.g., D.C.) changes in the voltage $V_{DD1}$ of the first power rail ($V_{DD1}$), the voltage of the first node 305 ($V_{305}$) is approximately equal to the voltage $V_{DD1}$ (e.g., the first capacitor 307 charges quickly enough for the first node 305 to track the voltage $V_{DD1}$). The voltage $V_{DD1}$ on the first node 305 is input by the first CMOS inverter 309a which in response thereto outputs the voltage $V_{SS}$ (e.g., the "inverse" of $V_{DD1}$) to the second CMOS inverter 309b. In response to the voltage $V_{SS}$ the second CMOS inverter 309b outputs the voltage $V_{DD1}$ to the third CMOS inverter 309c and the third CMOS inverter 309c outputs the voltage $V_{SS}$ to the gate lead of the first NFET 311. With the gate lead of the first NFET 311 at the voltage $V_{SS}$ (e.g., 0 volts), the first NFET 311 is OFF. The first single-rail ESD circuit 203a, therefore, has no affect on the D.C. operation of the ESD circuit 301.

If the resistance value for the first resistor 303 and the capacitance value for the first capacitor 307 are properly chosen, the first capacitor 307 will be unable to charge quickly enough to track the high frequency voltage increase on the first power rail ($V_{DD1}$) due to an ESD impulse. Accordingly, the voltage present on the input of the first CMOS inverter 309a initially remains at a low voltage relative to $V_{DD1}$ (e.g., the voltage of the ESD impulse) as the first capacitor 307 charges toward $V_{DD1}$. In response thereto, the first CMOS inverter 309a outputs the voltage $V_{DD1}$ to the second CMOS inverter 309b, the second CMOS inverter 309b outputs the voltage $V_{SS}$ to the third CMOS inverter 309c, the third CMOS inverter outputs the voltage $V_{DD1}$ to the gate of the first NFET 311, and the first NFET 311 turns ON so as to create a low impedance path between the first power rail ($V_{DD1}$) and to reference power-rail ($V_{SS}$).

The first NFET 311 remains ON until the first capacitor 307 charges to a voltage sufficient to cause the first CMOS inverter 309a to output the voltage $V_{SS}$ (and thus to cause the third CMOS inverter 309c to output the voltage $V_{SS}$, which turns OFF the first NFET 311). Accordingly, if the charging time for the first capacitor 307 is sufficiently long, the first NFET 311 will remain ON long enough to harmlessly dissipate the entire ESD impulse.

The charging time for the first capacitor 307 (and thus the "ON time" for the first NFET 311) is set by the RC time constant of the current path to the first node 305 (i.e., the first RC time constant). The resistance of the first RC time constant primarily comprises the resistance of the first resistor 303, and the capacitance of the first RC time constant primarily comprises the capacitance of the first capacitor 307 and the capacitance of the first inverter 309a (e.g., gate capacitance). A significant advantage of the present invention is that the first RC time constant is unaffected by the choice of the first clamp 211 so that the ON time of the first clamp 211 can be adjusted merely by tuning the resistance of the first resistor 303, the capacitance of the first capacitor 307 and the capacitance contributions of the first CMOS inverter 309a.

The second RC discriminator 213 of the second single-rail ESD circuit 203b similarly comprises a second resistor 313 connected between the second power rail ($V_{DD2}$) and a second node 315, and a second capacitor 317 connected between the second node 315 and the reference rail ($V_{SS}$). The second inverter logic 215 comprises a fourth CMOS inverter 319a having an input connected to the second node 315, a fifth CMOS inverter 319b having an input connected to the output of the fourth CMOS inverter 319a, and a sixth CMOS inverter 319c having an input connected to the output of the fifth CMOS inverter 319b. The second clamp 217 comprises a second NFET 321 having a gate lead connected to the output of the sixth CMOS inverter 319c. In the preferred embodiment of FIG. 3, the voltage $V_{DD2}$ is greater than the voltage $V_{DD1}$ and the level shifter 219 is provided to reduce the source-drain voltage, and thus the stress, applied to the second NFET 321. The level shifter 219 at FIG. 3 comprises a first diode 323a and a second diode 323b and thus provides an approximately 1.4 volt level shift (e.g., if $V_{DD1}$=2.5 volts, the voltage applied across the second NFET 321 is approximately 1.1 volts).

The operation of the second single-rail ESD circuit 203b is identical to the operation of the first single-rail ESD circuit 203a and is not described in detail herein. Most importantly, due to the second inverter logic 215, the RC time constant of the current path to the second node 315 (i.e., the second RC time constant) is not affected by the gate capacitance of the second NFET 321 and is primarily controlled by the resistance of the second resistor 313, the capacitance of the second capacitor 317, and capacitance contributions from the fourth CMOS inverter 319a. The ON time of the second clamp 217, therefore, can be adjusted merely by tuning the second resistor 313, the second capacitor 317 and the fourth CMOS inverter 319a.

As stated, the inter-rail ESD circuit 205 comprises the first and the second diode strings 221, 223 each connected between the first and the second power rails ($V_{DD1}$), ($V_{DD2}$). The first diode string 221 comprises a first plurality of series connected diodes 325a–d, and the second diode string 223 comprises a second plurality of series connected diodes 327a–d. In the preferred embodiment of FIG. 3, each diode string comprises four diodes, each having a forward voltage of about 0.7 volts so that the ESD trigger voltage required to forward bias each diode string is approximately 2.8 volts. It will be understood that any number of diodes may be employed and each diode may have any forward voltage. The preferred number of diodes per diode string is the number of diodes required for power-up and power-down sequence independence (as described below). However, sequence dependence may be desirable in certain applications (e.g., to address a user's particular power supply constraints, different inter-rail differential voltage limits, acceptable leakage levels, temperature sensitivity, etc.).

With a 2.8 volt ESD trigger voltage for each diode string 221, 223, and assuming $V_{DD1}$=1.8 volts and $V_{DD2}$=2.5 volts, the first and the second power rails ($V_{DD1}$), ($V_{DD2}$) may be powered-up and powered-down in any sequence without creating a current path between the first and the second power rails ($V_{DD1}$), ($V_{DD2}$). That is, absent an ESD or some other overvoltage condition, the largest voltage that can be present between the first and the second power rails ($V_{DD1}$), ($V_{DD2}$), and thus across the first and the second diode strings 221, 223, is 2.5 volts when the first power rail ($V_{DD1}$) is grounded (e.g., $V_{DD1}$=0), and the second power rail ($V_{DD2}$) is ON (e.g., $V_{DD2}$=2.5 volts). In this case, the first plurality of diodes 325a–d is reversed biased and is OFF, and the second plurality of diodes 327a–d has only about 2.5 volts– 1.4 volts=1.1 volts thereacross due to the level shifter 219, and therefore is insufficiently forward biased to turn ON. Complete sequence independence thereby is provided.

Inter-rail ESD protection is provided with sequence independence. For instance, if an ESD impulse is induced on the first power rail ($V_{DD1}$) relative to the second power rail ($V_{DD2}$) so as to raise the second power rail ($V_{DD1}$) more than 2.8 volts above the second power rail ($V_{DD2}$), the first diode string 221 will conduct and create a low impedance path between the first and the second power rails ($V_{DD1}$), ($V_{DD2}$) that harmlessly dissipates the ESD impulse. Similarly, if an ESD impulse is induced on the second power rail ($V_{DD2}$) relative to the first power rail ($V_{DD1}$) so as to raise the second power rail ($V_{DD2}$) more than 4.2 volts (e.g., 2.8 volts for the second diode string 223 plus 1.4 volts for the level shifter 219) above the first power rail ($V_{DD1}$), the second diode string 223 will conduct and create a low impedance path between the first and the second power rails ($V_{DD1}$), ($V_{DD2}$) that harmlessly dissipates the ESD impulse.

A significant advantage of the inventive inter-rail ESD circuit 205 is that its ESD trigger voltage is scaleable for use with any power rail voltages merely by increasing or decreasing the number of diodes within each diode string 221, 223. That is, increasing the number of diodes increases the ESD trigger voltage, while decreasing the number of diodes decreases the ESD trigger voltage. When the inter-rail ESD circuit 205 is combined with the first and the second single-rail ESD circuits 203a, 203b, an easily tunable, preferably NFET based, scaleable ESD protection circuit for multiple power rail applications, including low voltage, low power and high performance applications, results.

Figure 4:
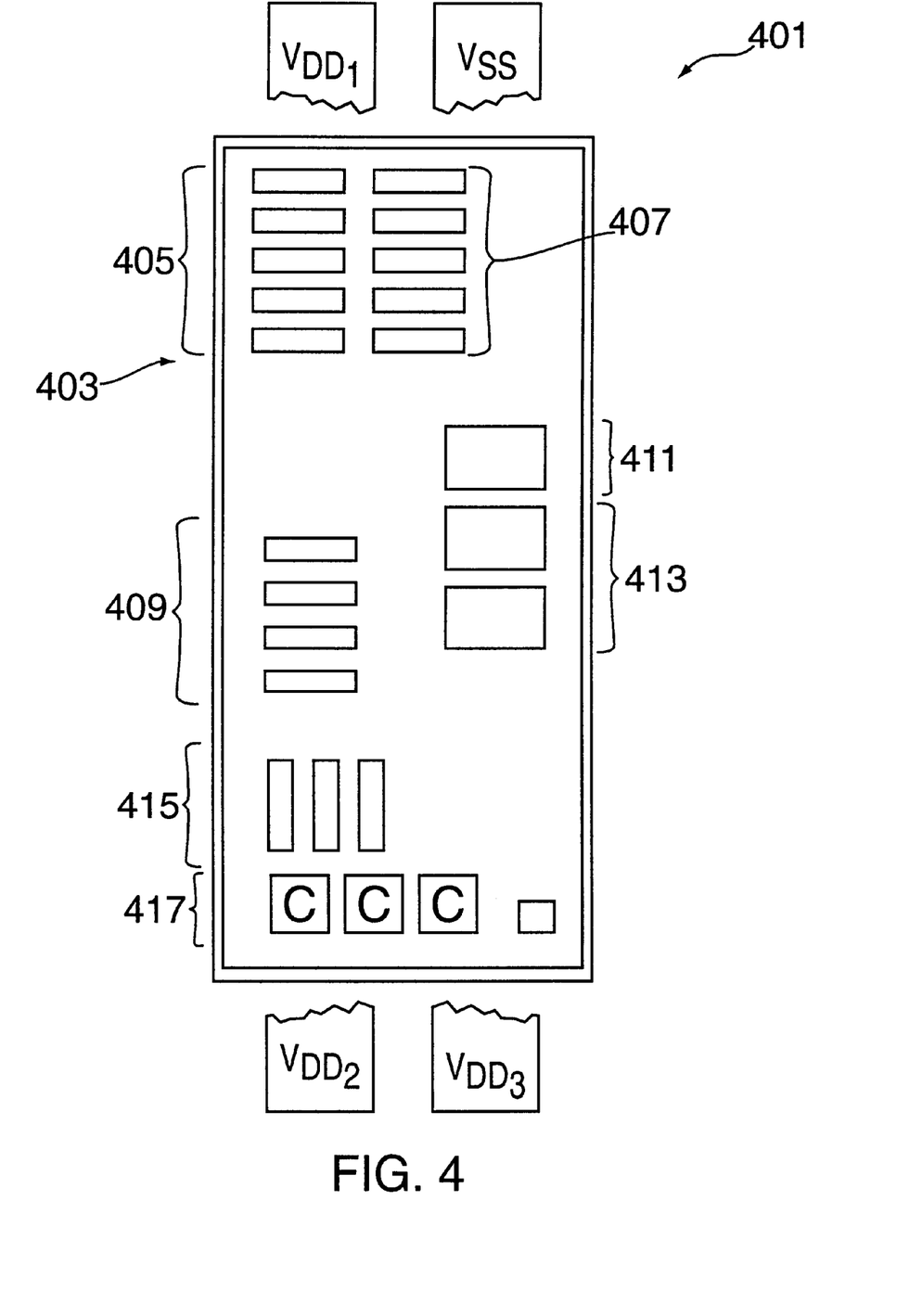
FIG. 4 is a schematic diagram of an inventive ASIC book of gate-array format ESD components and functional blocks for use in constructing customized ESD networks in accordance with a second aspect of the invention.

FIG. 4 is a schematic diagram of an inventive ASIC book 401 of gate-array format ESD components and functional blocks for use in constructing customized ESD networks in accordance with a second aspect of the invention. Specifically, the ASIC book 401 comprises a sea of gate elements 403 comprising a plurality of n-channel transistors 405 and a plurality of p-channel transistors 407, a plurality of inverter stages 409, a plurality of diodes 411, a plurality of diode strings 413, a plurality of resistor elements 415 and a plurality of capacitor elements 417 for interconnecting between any number of power rails ($V_{DD1}$), ($V_{DD2}$), ($V_{DD3}$) and a reference rail ($V_{SS}$). Within the ESD ASIC book 401, each component is "unconnected" to other components in typical gate-array format so as to form an ESD repository of user-selectable components. The various components within the ESD repository may be interconnected via an interconnection method such as a final metallization step (e.g., a WRIT B process) or via another known process or technique according to a user-specified pattern so as to achieve a user-specified function.

By employing the ASIC book 401, ESD networks can be customized and optimized for each user's specific circuit implementation. For example, if the ASIC book 401 is used to form the inventive ESD network 301 of FIG. 3, the RC characteristics of the first and the second RC discriminators 207, 213 may be tuned for optimum ESD/EOS protection by:

1. selecting different resistance value resistors from the plurality of resistor elements 415 for use as the first and the second resistors 303, 313;
2. selecting different capacitance value capacitors from the plurality of capacitor elements 417 for use as the first and the second capacitors 307, 317; and
3. selecting inverters having different channel width and channel length transistors from the inverter stages 409 for use as the first and the fourth CMOS inverters 309a, 319a.

Resistors and capacitors can be coupled in series or in parallel to affect different resistance and capacitance values and further optimization. Additionally, the size of the first and the second NFETs 311, 321 may be varied for optimum ESD protection, and the number of diodes within the first and the second diode strings 221, 223 may be varied to achieve power-up and power-down sequence independence for different power rail voltage applications if desired and/or to adjust the ESD trigger voltage for the diode strings. Other sequence independent or sequence dependent ESD functional blocks may be defined within the ASIC book 401 to address a user's particular power supply constraints, different inter-rail differential voltage limits, acceptable leakage levels, temperature sensitivity, etc.

The elements within the ESD repository preferably are optimized for ESD/EOS protection. For instance, the MOSFETS within the sea of gate elements 403 preferably are provided with large gate-to-contact spacings, local interconnect wiring or contact bars, natural resistor ballasting, series resistance elements, local substrate contacts for NFETs, local well taps for PFETs, etc. The diodes 411 and the diode strings 413 preferably comprise diode fingers that may be wired in series or in parallel to provide single, high perimeter diodes or diode strings between power rails. Additional elements such as grounded gate NFETs (e.g., for use as overvoltage clamps) can be provided within the ASIC book 401 for other ESD network configurations.

Each resistor element within the plurality of resistor elements 415 may comprise any known resistor element such as a BR resistor (e.g., a gate structure which acts as a block mask to form a resistor), an n+ or p+ diffusion resistor, a salicided blocked diffusion resistor, an n-well resistor, etc. Similarly, each capacitor element within the plurality of capacitor elements 417 may comprise any known capacitor element such as a BR capacitor, an n+ or p+ diffusion capacitor, a MOSFET, a metal-to-metal capacitor, a trench capacitor, etc. The diodes 411 and the diode strings 413 may comprise NPN or PNP transistors, and the plurality of inverter stages 409 may comprise CMOS inverter stages. Additionally, the plurality of inverter stages 409, the plurality of resistor elements 415 or the plurality of capacitor elements 417 may be formed from the sea of gate elements 403.

Figure 5:
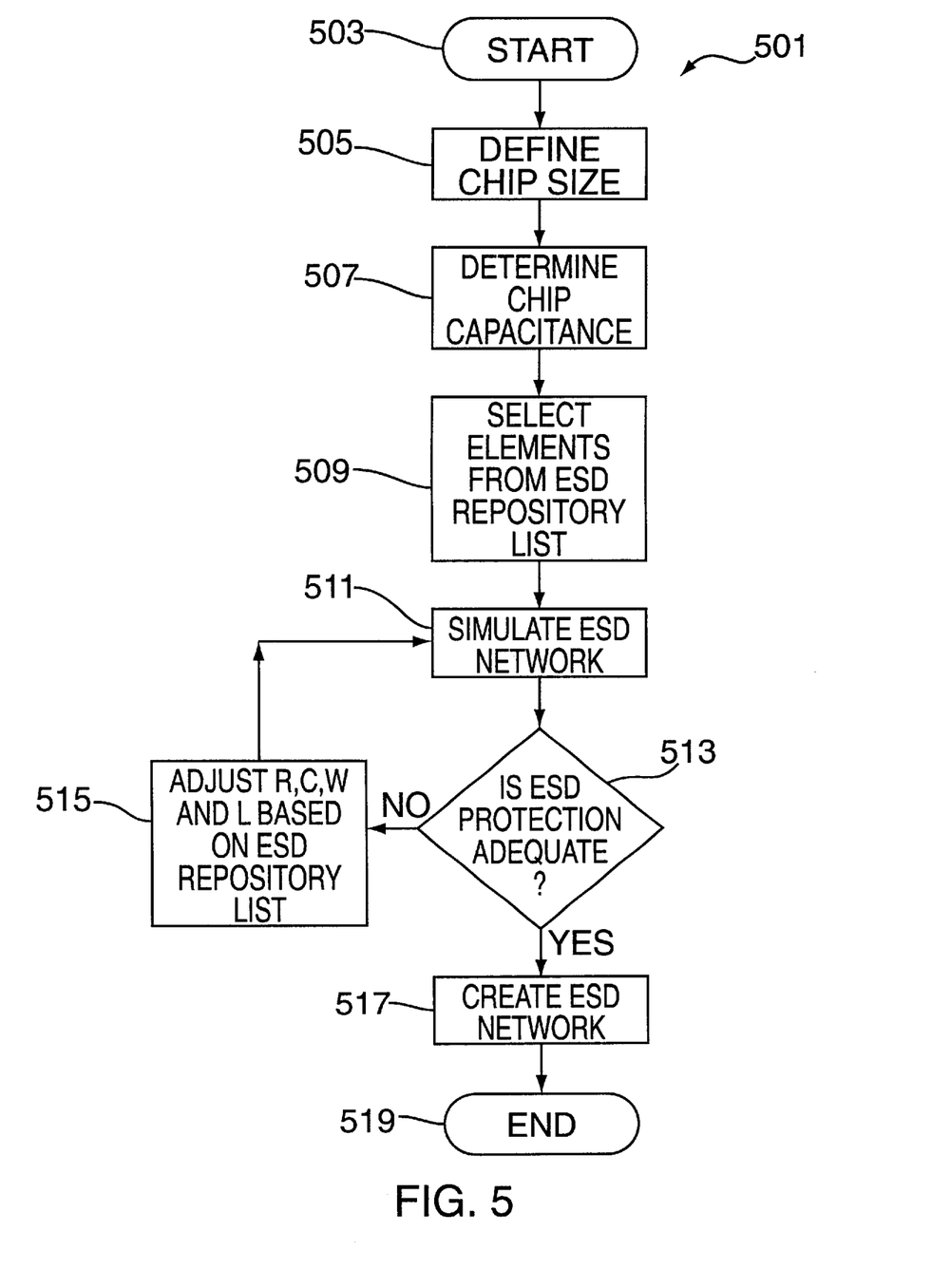
FIG. 5 is a flowchart of an inventive method for automatically generating a custom ESD network in accordance with a third aspect of the invention.

FIG. 5 is a flowchart of an inventive method 501 for automatically generating a custom ESD network in accordance with a third aspect of the invention. Specifically, the inventive method 501 allows a customized and optimized ESD network to be generated for an integrated circuit based on one or more characteristics of the integrate circuit (e.g., chip size and chip capacitance) without requiring a user of the method to have an in-depth knowledge of the ESD network generated by the method. Preferably the ESD network generated by the inventive 501 method is the inventive ESD network 301 of FIG. 3 formed from the ASIC book 401 of FIG. 4, although any ESD network may be similarly formed.

With reference to FIG. 5, in step 503 the inventive method 501 is started. In step 505 a user specifies the chip size (e.g., the physical layout area of the chip) for the integrated circuit to which ESD protection is to be provided. Thereafter, in step 507, the user specifies the total chip capacitance of the integrated circuit. Step 507 is the last step requiring user input, and after step 507 control passes to step 509.

In step 509, based on the user-specified chip size and user-specified chip capacitance, appropriately valued components for a customized ESD network are automatically selected. The selected components, for instance, may comprise resistors to serve as the first and the second resistors 303 and 313, capacitors to serve as the first and the second capacitors 307 and 317, inverters to serve as the CMOS inverters 309a–c and 319a–c, transistors to serve as the first and the second NFETs 311, 321, diodes to serve as the level shifter diodes 323a–b, and diodes to serve as the diodes 325a–d, 327a–d within the first and the second diode strings 221, 223, respectively.

In step 511, the ESD behavior of the customized ESD network is simulated. The ESD behavior may be simulated using any circuit simulation software package (e.g., an electrothermal simulation program such as SPICE).

In step 513, the adequacy of the ESD protection provided by the simulated ESD network is evaluated. If the level of ESD protection provided by the simulated ESD network is adequate for the user's implementation then control passes to step 517 wherein a hard wired version of the customized ESD network is created (e.g., by performing a final metallization step to interconnect the selected components of the ASIC book 401) and then to step 519 wherein the inventive method 501 ends; otherwise control passes to step 515.

In step 515, because the simulated ESD network provided inadequate ESD protection, the values of the components employed within the ESD network are tuned and the behavior of the ESD network is re-simulated. For example, the selected components may be tuned by varying the resistances of the first and the second resistors 303, 313, the capacitances of the first and the second capacitors 307, 317 and the gate capacitances of the first and the fourth inverters 309a, 319a (e.g., by varying the channel length and/or width of the transistors employed therein) so as to tune the ON time for the first and the second NFETs 311, 321. Other ESD functional units may be similarly tuned to affect variations in ESD behavior of the ESD network.

If the simulated behavior of the tuned ESD network is adequate the ESD network is created in step 517; otherwise the selected components are re-tuned and the ESD behavior of the ESD network is re-simulated. This process is continued until adequate ESD protection is provided by the ESD network. In this manner, based on one or more integrated circuit characteristics provided by a user, a customized and optimized ESD network is automatically generated by the inventive method 501.

The foregoing description discloses only the preferred embodiments of the invention, modifications of the above disclosed apparatus and method which fall within the scope of the invention will be readily apparent to those of ordinary skill in the art. For instance, other ESD components than those described may be employed within the ASIC book 401, and any type of ESD protection may be generated therefrom. Similarly, the inventive method 501 may be employed to automatically generate any type of ESD network.

Accordingly, while the present invention has been disclosed in connection with the preferred embodiments thereof, it should be understood that other embodiments may fall within the spirit and scope of the invention, as defined by the following claims.

The invention claimed is:

1. A method of forming a customized ESD network for a circuit having a first, a second and a third power rail, the method comprising:

providing a plurality of selectable elements for use within an ESD network;

selecting at least a first resistor element and at least a first capacitor element from the plurality of selectable elements for use as a first RC discriminator network;

selecting a first plurality of transistor elements from the plurality of selectable elements to form a first plurality of inverters for connecting to the first RC discriminator network;

selecting a first transistor element from the plurality of selectable elements to form a first clamp for connecting to the first plurality of inverters and for connecting between the first and the third power rails;

selecting at least a second resistor element and at least a second capacitor element from the plurality of selectable elements for use as a second RC discriminator network;

selecting a second plurality of transistor elements from the plurality of selectable elements to form a second plurality of inverters for connecting to the second RC discriminator network;

selecting a second transistor element from the plurality of selectable elements to form a second clamp for connecting to the second plurality of inverters and for connecting between the second and the third power rails; and selecting a plurality of diode elements from the plurality of selectable elements for connecting between the first and the second power rails for providing power-up sequence independence and power-down sequence independence between the first and second power rails.

2. The method of claim 1 further comprising:
simulating the ESD behavior of an ESD network formed from the selected elements; and
determining whether the simulated ESD behavior of the ESD network is adequate.

3. The method of claim 1 wherein selecting the plurality of diode elements includes:
selecting a first series of diodes for connecting between the first power rail and the second power rail and having a first polarity orientation; and
selecting a second series of diodes for connecting in parallel with the first series of diodes between the first power rail and the second power rail and having a second polarity orientation that is opposite to the first polarity orientation.

4. The method of claim 1 wherein selecting a plurality of diode elements includes selecting the number of diodes in a first diode string required to prevent conduction of the first diode string when one of the first power rail and the second power rail is grounded.

5. The method of claim 4 wherein selecting a plurality of diode elements includes selecting the number of diodes in a second diode string required to prevent conduction of the second diode string when one of the first power rail and the second power rail is grounded, wherein the second diode string has a polarity orientation that is opposite to a polarity orientation of the first diode string.

* * * * *